United States Patent [19]

Martyniak

[11] 4,254,448

[45] Mar. 3, 1981

[54] TECHNIQUES FOR ASSEMBLING ELECTRICAL COMPONENTS WITH PRINTED CIRCUIT BOARDS

[75] Inventor: Gerald J. Martyniak, Indianapolis, Ind.

[73] Assignee: Western Electric Company, Inc., New York, N.Y.

[21] Appl. No.: 38,742

[22] Filed: May 14, 1979

[51] Int. Cl.³ .......................... H05K 3/34; H05K 7/06
[52] U.S. Cl. ...................................... 361/409; 29/832; 29/840
[58] Field of Search ................ 29/626, 627, 589, 840, 29/832; 361/400, 401, 409; 174/68.5; 264/249, 272; 156/73.1, 73.2, 73.3, 73.4; 58/23 R

[56] References Cited

U.S. PATENT DOCUMENTS

| | | | |
|---|---|---|---|
| 2,705,346 | 4/1955 | Schlabach et al. | 264/249 |
| 3,577,292 | 5/1971 | Obeda | 156/73.1 |
| 4,086,696 | 5/1978 | Ikuta | 29/627 |
| 4,095,334 | 6/1978 | Uchida . | |

FOREIGN PATENT DOCUMENTS

2640816  3/1977  Fed. Rep. of Germany .......... 58/23 R 1519700  8/1978  United Kingdom .

Primary Examiner—Francis S. Husar
Assistant Examiner—C. J. Arbes
Attorney, Agent, or Firm—J. L. Landis

[57] ABSTRACT

Electrical components (10 or 30) are fastened to a mounting surface (16) of a printed circuit board (11) by forming a plurality of thermoplastic pins (20, 35) projecting from the mounting surface of the board adjacent to positions where components are to be located. The component is placed on the board so that portions of the component are located adjacent to portions of the pins, following which portions of the pins are heated and formed about portions of the component to form plastic locking sections (22 or 37) that fasten the component to the board in a desired position. The mounting surface (16) of the board may be formed with a pocket (18 or 33) that receives and positions the component at the desired location, so that component leads (17 or 32) extend along the mounting surface to positions overlapping lead-contact areas (14, 34) of printed contact patterns deposited on the mounting surface, after which the leads are attached to the contact areas, as by reflow soldering.

18 Claims, 8 Drawing Figures

U.S. Patent  Mar. 3, 1981  Sheet 1 of 3  4,254,448
FIG.-1
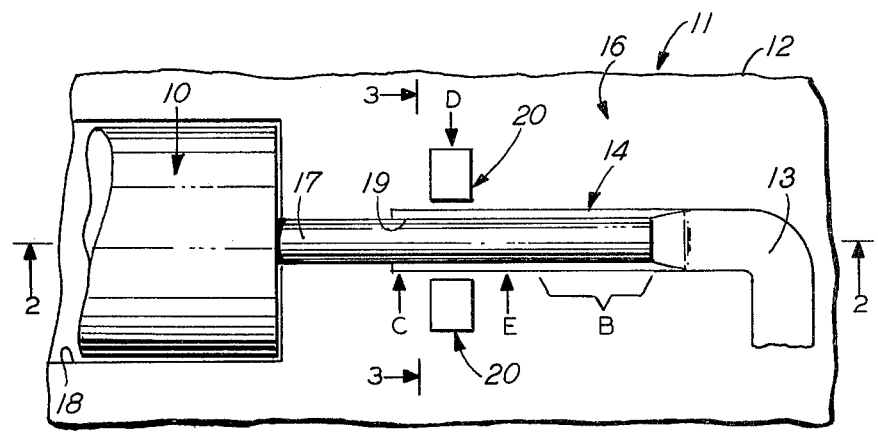
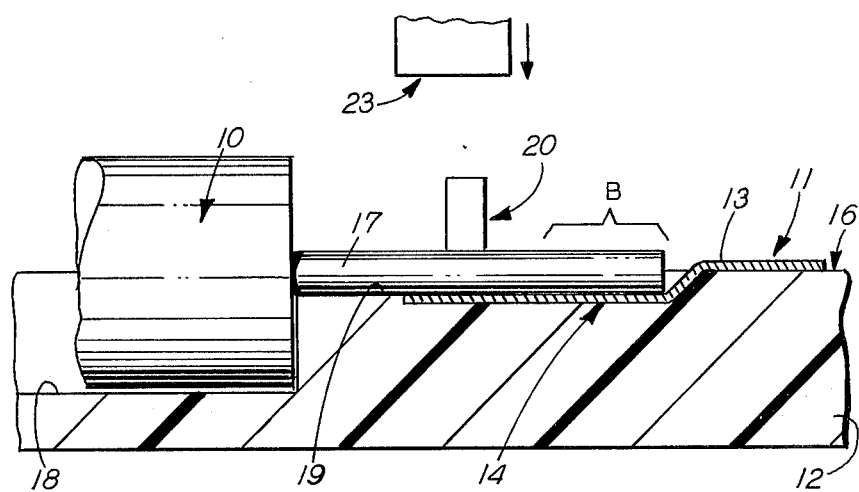
FIG.-2

TECHNIQUES FOR ASSEMBLING ELECTRICAL COMPONENTS WITH PRINTED CIRCUIT BOARDS

TECHNICAL FIELD

This application relates generally to methods of assembling electrical components with printed circuit boards, and to circuit-component assemblies fabricated by such methods. More particularly, the invention relates to improved techniques for mechanically fastening components to printed circuit boards having thermoplastic substrates, so that component leads may be bonded to conductive contact areas deposited on a mounting surface of the circuit board.

BACKGROUND OF THE INVENTION

In the past, electrical components have been attached to printed circuit boards by various different techniques. One process, commonly used with axial-leaded components such as resistors, involves inserting the leads into holes in the board, and then clinching or staking the tips of the leads to the board to mechanically fasten the component to the board, after which the leads are connected to conductive printed-circuit areas or contact pads on a surface of the board as by soldering.

Another process, "reflow soldering," as discussed in more detail hereafter, is often used with multiple flat-leaded components, such as integrated circuits, wherein the component is physically held against a mounting surface of the board with the leads engaging contact pad areas on that surface. Either or both of the leads and pads are coated with solder, and the solder areas are subject to localized heating to melt the solder and make a bond.

An object of this invention is to provide a simple, low-cost fastening technique, wherein components of various different sizes and shapes may be mechanically fastened to the board at desired locations prior to any standard lead-attach step, by simple plastics-molding and forming techniques and structures. The process is especially useful to provide high-integrity mechanical connections, particularly in a solder-reflow process, where the component leads cannot be inserted into holes in the board, and also for use with molded thermoplastic substrates.

SUMMARY OF THE INVENTION

With the foregoing and other objects in view, methods, assemblies, and products in accordance with certain features of the invention relate to assembling a component with a printed circuit board, wherein the board is formed with a plurality of thermoplastic pins projecting from the board adjacent to positions where a component is to be received. The component is placed on the board so that portions of the component are located adjacent to portions of the pins, and portions of the pins are formed about portions of the component so as to fasten the component to the board.

Preferably, the pins are formed by heating the outer ends of the pins to melt the plastic and simultaneously causing flow of the melted portions about adjacent portions of the component to form plastic locking sections that fasten the component to the board, particularly using a heated melting-and-forming element that contacts the melted plastic and has a contact face that forms the melted plastic into the locking section. In accordance with certain features of the invention, the pins have chamfered tips and the heating and forming element is an ultrasonic plastic-melting horn having an angular contact face to mold the plastic.

In accordance with other features of the invention, the printed circuit includes a molded thermoplastic substrate, the pins comprise molded thermoplastic elements extending outwardly from a mounting surface of the substrate, and the mounting surface is formed with a pocket for receiving and locating a body portion of the component so that projecting electrical leads of the component extend along the mounting surface of the substrate to positions in alignment with lead-contact areas of a printed circuit pattern deposited on the mounting surface. After the component has been fastened in place, the leads are attached to the contact areas in any suitable fashion, such as by reflow soldering. The mounting surface may be formed with grooves for receiving the leads, which grooves may be coated with conductive material to define the lead-contact areas in the grooves.

Other objects, specific advantages, and features of the invention will be apparent from the following detailed description of specific examples and embodiments thereof, when read in connection with the accompanying drawings.

BRIEF DESCRIPTION OF THE DRAWINGS

In the drawings, FIG. 1 is a top plan view of a portion of a printed circuit board and a cylindrical electrical component to be assembled therewith in accordance with one specific embodiment of the invention.

FIG. 2 is a vertical section along line 2—2 of FIG. 1, with certain vertical dimensions being exaggerated to illustrate principles.

DETAILED DESCRIPTION

Figure 3:
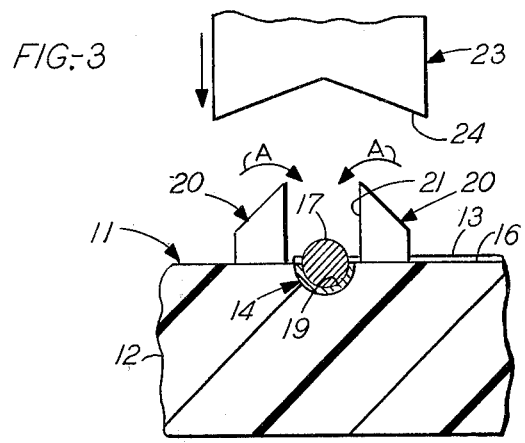
FIG. 3 is a transverse vertical section along line 3—3 of FIG. 1, illustrating certain elements prior to fastening of the component to the board.

Referring now in detail to the drawings, FIGS. 1–5 illustrate techniques and mounting structure in accordance with one specific embodiment of the invention, for assembling an electrical component 10 with a printed circuit board 11. Preferably, the board 11 consists of a molded thermoplastic substrate 2, having printed-circuit conductor patterns, such as 13 and lead contact areas 14 deposited in any conventional fashion on a first, or component-mounting surface 16 of the substrate 12. In the example illustrated in FIGS. 1–5, the component 10 is a cylindrical resistor having axially projecting cylindrical leads 17 (one shown), which are to be bonded to corresponding contact areas 14 of the printed circuit 11 in any known fashion, such as a reflow soldering process described hereafter.

In the case of an axial-leaded cylindrical component 10, such as illustrated in FIGS. 1–3, the substrate 12 is preferably formed with a hemicylindrical recess or pocket 18 moled into the mounting surface 16 of the substrate during manufacture. The pocket 18 is shaped to closely receive the cylindrical body of the component 10 so as to mount the component on the board at a desired location with the leads 17 extending along the mounting surface 16 of the substrate.

Preferably, the mounting surface 16 is also formed with molded arcuate grooves 19 for receiving and aligning each lead 17 in a desired position on the board. Portions of the groove 19 are preferably coated or plated with the printed circuit conductor material so as to define in the groove the lead-contact area 14 of the circuit, particularly along a lead-bonding region B near the right end in FIGS. 1-2. The conductive-groove contact area 14 is connected to and constitutes a continuation of one of the printed circuit conductors, such as the conductor 13 at the right in FIGS. 1-2. Alternatively, the contact area 14 in the groove may be connected to a transverse printed circuit conductor at any point along the conductive portion of the groove. While plated arcuate grooves 19 are preferred, particularly for relatively large-diameter cylindrical leads. to precisely locate the component leads relative to the printed circuit and to maximize surface contact area between the lead 17 and the contact area 14, it would also be possible to have the leads extend along a flat surface of the substrate in surface engagement with planar land areas or contact pads to which the leads are to be soldered or otherwise attached.

In accordance with certain features of this invention, in order to mechanically fasten the component 10 to the board 11 in the desired position preparatory to the lead-attach operation, the substrate 12 is formed with a plurality of thermoplastic studs or pins 20, projecting outwardly from the mounting surface 16 and defining spaces 21 (FIG. 3) therebetween for receiving portions of the components 10 adjacent to portions of the pins 20. In the example in FIGS. 1-5, the pins 20 are arranged to straddle a midsection of each lead 17 located between the component body and the end of the lead. Preferably, the pockets 18, grooves 19 and pins 20 are all formed during a plastics-molding operation process used to form the substrate 12.

After the component 10 has been properly positioned on the board 11 as illustrated in FIGS. 1-3, portions of the pins 20 are heated and formed about adjacent portions of the component 10, as generally indicated by arrows A—A in FIG. 3, so as to mechanically fasten the component to the board in the desired position. Preferably, the upper ends of the pins 20 are softened or melted and bent or caused to flow over adjacent portions of the component in any convenient fashion, as by ultrasonic melting or by utilizing a heated platen, to form a plastic locking section, such as section 22 in FIG. 5, that fastens the adjacent portions of the component to the board.

Figure 4:
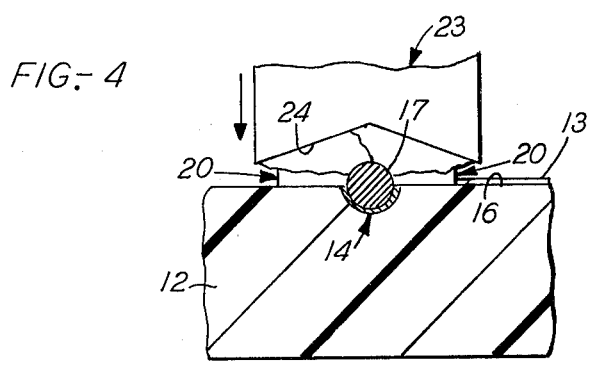
FIGS. 4–5 are views similar to FIG. 3, showing the elements during and after the fastening process.
Figure 5:
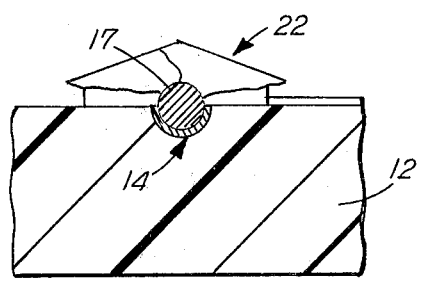

In the example of FIGS. 3-5, the plastic is simultaneously melted and formed by a generally conventional ultrasonic melting horn 23 having an angular, preferably V-notched face 24 shaped to melt the plastic tips of the pins 20 and to form the melted plastic into the desired shape of the locking section, as illustrated in FIGS. 4-5. In this example, the pins 20 are preferably rectangular tabs having flat vertical walls facing the mounting section of the component (lead 17 in FIG. 3), and having chamfered tips that taper downward toward the substrate 12 in the direction away from the center at an angle of about 45°, as illustrated in FIG. 3.

The use of chamfered pins 20, with pointed tips as illustrated in FIG. 3, facilitates the initiation of the plastic-melting and forming process, as the pointed tips serve as energy directors for the horn 23. In practice, the horn 23 is lowered from the position shown in FIG. 3 to that of FIG. 4 engaging the upper surface of the molten plastic, so that the molten plastic is forced to flow inwardly and downwardly about the top of the lead 17 until it fills the entire space between the V-shaped face 24 of the horn 23 and the lead 17 and substrate 12 so as to form a secure plastic locking section about the lead 17, shaped as shown in FIGS. 4 and 5, after the horn 23 has been removed. In the example of FIGS. 1-3, where two pins 20-20 are positioned directly across from each other, the molten plastic material from the spaced pins runs together at the top, as shown in FIGS. 4-5 to form a joint locking section 22 covering and bridging the lead, wherein the jagged line at the top indicates a typical boundary line where the material from the top pins is joined together at the top. A limited amount of the molten material may also flow longitudinally outward along the length of the lead 17, to the left and right as viewed in FIGS. 1-2, and this provision furnishes a flow path for excess plastic material. In practice, the horn 23 has a length (form left-to-right in FIG. 2) about double the width of pins 20.

Figure 6:
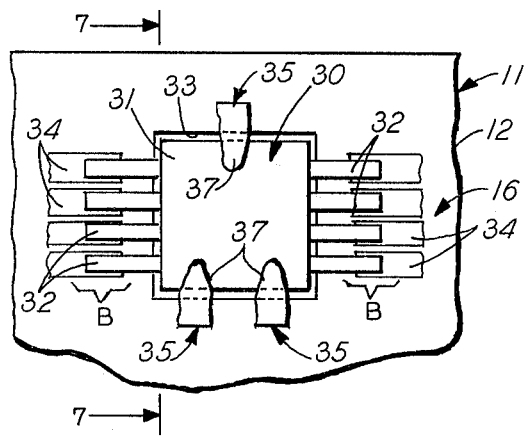
FIG. 6 is a top view similar to FIG. 1, showing techniques for fastening a flat component to the board.
Figure 7:
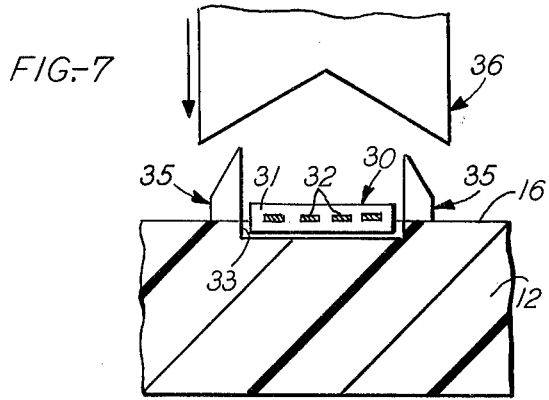
FIG. 7 is a transverse vertical section along line 7—7 of FIG. 6, illustrating certain elements prior to fastening the component to the board.
Figure 8:
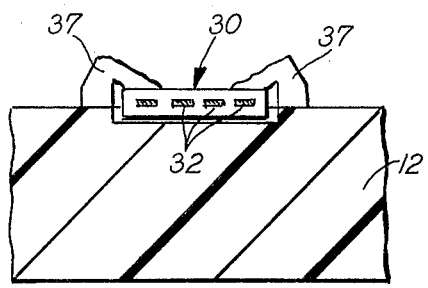
FIG. 8 is a view similar to FIG. 7, showing the parts after the fastening process.

As discussed hereafter in connection with FIGS. 6-8, it is also possible to use individual spaced pins, such as 20, mounted adjacent to the component or lead, wherein the molten plastic from two opposed pins does not flow together at the top as in the example of FIGS. 1-5. Also, it is possible to use various other heating-and-forming techniques, such as a heated platen similar in shape to the horn 23 in FIGS. 3-4, to melt the plastic and simultaneously form it about the adjacent portion of the component so as to make a desired shape of locking section 22.

After this component-fastening step, the leads 17 are then attached to the contact areas 14 of the printed circuit in any suitable fashion, such as by reflow soldering. In reflow soldering, either the adjacent surface of the lead 17 or of the contact section 14, or both, is precoated with solder, such as along the contact area B in FIGS. 1 and 2 between the pins 20 and the end of the lead. In this process, a heated platen (not shown) is moved down into engagement with the leat 17 along the contact section B, to apply localized heat to the lead 17 sufficient to melt the solder and form a secure bond, as is generally well known in the art. Localized heating processes, such as reflow soldering or laser soldering, are particularly preferred for use with thermoplastic substrates 12, to avoid possible damage to the substrate. However, it should be appreciated that any type of lead-attaching techniques can readily be used with the subject process of attaching components to printed circuits.

Of course, the thermoplastic pins or tabs 20, and any pockets 18 or grooves 19 utilized, are shaped and positioned to fit the particular size and shape of each individual component 10, so that the pins 20 may be heated and formed to fasten any desired portion of the component to the substrate in a desired position. In the case of a flat component, such as an IC pack 30 shown in FIGS. 6-8, for example a hybrid integrated circuit (HIC) having a flat rectangular body 31 and a plurality of projecting flat leads 32-32, the body 31 is received in a corresponding pocket 33 of the substrate 12 so that the ends of the leads 32 overlap and fit against lead-contact areas of printed circuit conductors 34—34 deposited on the substrate 12. In this example, it is preferred to provide a set of three or more plastic tabs 35 (shown prior to the heating-and-forming step in FIG. 7) that are generally similar to the pins 20 in FIGS. 1–3 and are arranged on opposite sides of the IC pack 30; for example, in the three-tab offset top-and-bottom arrangement illustrated in FIG. 6.

In this example, a similar ultrasonic melting horn 36 is lowered to melt the upper portions of the tabs 35 and to form irregular sections 37, as shown in FIGS. 6 and 8, that lock the adjacent portions of the IC body section 31 to the substrate 12. After this, the leads 32 may be attached to the conductors 34 by any suitable process, such as reflow soldering at areas B—B of overlap between the leads 32 and the conductors 34, as previously described.

In the embodiment of FIGS. 1–3, it is not necessary that the pins 20—20 be mounted across from each other as shown in FIGS. 1–3, so that the melted portions run together to form a single composite locking section 22 as in FIG. 5. It is also possible to mount the pins in staggered positions on opposite sides of the lead 17, such as indicated by arrows C, D, E in FIG. 1, in which case the melted pin material forms isolated individual locking sections on opposite sides of the lead, similar to the individual locking sections 37 in FIGS. 6 and 8.

Where desired, a first set of components may be attached to one surface of the board, such as the upper surface 16 in FIGS. 1–8, and then the board 11 may be flipped over to attach additional components to the reverse side of the board. In a specific example of use of the invention, the printed circuit board 11 is used in a pushbutton "dial" assembly for a telephone, and may be of the type described in my copending U.S. patent application "Printed Circuits and Methods of Making," Ser. No. 970,946 filed Dec. 19, 1978, herein incorporated by reference. In that example, it is desired to attach all of the electrical components to a single side 16 of the board, the reverse side being used for printed switch-contact arrays operated by the pushbuttons. In this example, conductive through-hole connections may be made as disclosed in the copending application, wherever a component is to be connected to a switch contact on the reverse side of the board.

As described in the copending application, the substrate 12 is preferably formed of a molded thermoplastic material, such as "Ryton R-4", a polyphenylene sulfide material marketed by Phillips Petroleum Company of Bartlesville, Oklahoma; a polysulfone resin such as "Udel 1700, " marketed by Union Carbide Corporation of New York, N.Y.; or a glass-filled ABS resin (acrylonitrile-butadiene-styrene resin), such as "AB-1004" marketed by Liquid Nitrogen Processing Corporation of Malverne, Penna. Thermoplastics are preferred because of low cost; ease in fabrication by conventional plastics-molding techniques, including formation of alignment holes, through holes, and component locating and assembly elements such as the pockets 18 and 33, the grooves 19, and the pins 20 and 35; and better sprayed-metal adhesion characteristics as discussed below.

As described in the copending application, the printed-circuit conductors are preferably flame-sprayed conductors of conductive metals, such as copper or nickel, deposited on a zinc primer coating on the substrate 12 in the desired patterns. This process is particularly useful in coating irregular substrate surfaces 16, as in the dial pad assembly described in the copending application, and also in coating surface grooves such as 19 to form the contact areas 14, while providing a continuous conductive area connection with an adjacent printed-circuit conductor such as the conductor 13 at the right in FIG. 2. However, as will be apparent, the present invention may readily be used with virtually any type of printed circuit and component assembly, and any type of lead-bonding or attaching process.

While various specific examples and embodiments of the invention have been described in detail hereinabove, it should be obvious that various modifications may be made from the specific details, steps and materials described, without departing from the spirit and scope of the invention.

What is claimed is:

1. An improved method of connecting an electrical component having leads projecting therefrom with a printed circuit board having a conductive pattern deposited on a mounting surface of an insulating substrate and having lead-contact areas deposited on the substrate at locations where the leads are to be electrically connected to the printed circuit, the method being of the type including the steps of (a) placing the component on the mounting surface of the board at a predetermined position in which the leads are aligned with the contact areas, and (b) thereafter bonding the leads to the contact area, wherein the improved method comprises the additional steps of:
    (c) forming a plurality of thermoplastic pins projecting outward from the substrate at locations adjacent to positions where portions of the component are placed in step (a); and
    (d) after step (a) and before step (b), heating and forming end portions of the pins about the adjacent portions of the component so as to form plastic locking sections that mechanically fasten the adjacent portions of the component to the board at the predetermined position and so that the leads align with the lead-contact areas of the printed circuit for the lead-bonding step.

2. A method as recited in claim 1, wherein the board includes a molded thermoplastic substrate and the pins comprise molded thermoplastic elements extending outwardly from the mounting surface of the substrate.

3. A method as recited in claim 2, wherein the mounting surface of the substrate is formed with a pocket for receiving and locating a body portion of the component with respect to the printed circuit patterns deposited on the mounting surface of the substrate.

4. A method as recited in claim 3, wherein the pocket is so formed and located that projecting electrical leads of the component extend from the body portion along the mounting surface of the substrate to positions overlapping the associated lead-contact areas of the printed circuit patterns; and wherein portions of the leads are subsequently attached to the contact areas.

5. A method as recited in claim 4, wherein the mounting surface of the substrate is also formed with grooves for receiving and aligning the leads with respect to the patterns.

6. A method as recited in claim 5, wherein portions of the grooves are coated with the printed-circuit conductor material to define the lead-contact areas in the grooves.

7. A method as recited in claim 6, wherein the grooves are arcuate grooves, shaped to fit and make substantial surface area contact with cylindrical leads of the component received in the grooves.

8. A method as recited in any of claims 4, 6 or 7, wherein the leads are attached to the contact areas by reflow soldering.

9. A method as recited in claim 1, wherein the heating and forming step includes melting the outer ends of the pins and simultaneously causing flow of the melted portions about adjacent portions of the component to form the plastic locking sections that fasten the adjacent portions of the component to the board.

10. A method as recited in claim 9, wherein the pins are formed with chamfered tips that taper toward the substrate in the direction away from the adjacent portion of the component.

11. A method as recited in claim 10, wherein the molten portions of the pins are formed about the adjacent portions of the component by a heating element that contacts the tips of the pins and has an angular contact face shaped to form the melted plastic into the locking section.

12. A method as recited in any of claims 9, 10 or 11, wherein the pins comprise rectangular tabs having flat vertical walls facing the adjacent mounting portions of the component.

13. A printed circuit-and-component assembly fabricated in accordance with the methods of claim 12.

14. A method as recited in claim 12, wherein the heating and forming process is performed by an ultrasonic plastic-melting horn having a contact face for melting and forming the thermoplastic material.

15. A method as recited in any of claims 9, 10 or 11, wherein at least two pins are positioned across from each other sufficiently close together that portions of the molten plastic from the two pins run together to form a joint locking section covering and bridging the adjacent portion of the component.

16. A printed circuit-and-component assembly fabricated in accordance with the methods of claim 15.

17. A method of fabricating a printed circuit board and connecting electrical components thereto, which comprises:
   (a) molding a thermoplastic substrate having a component-mounting surface, at least one pocket in that surface for receiving and locating a body portion of a component so that component leads extend along the mounting surface, and a plurality of molded thermoplastic studs projecting outwardly from the mounting surface at spaced positions adjacent to selected portions of components received in the pockets;
   (b) depositing a printed-circuit pattern on the mounting surface, including lead-contact areas at regions where the component leads are to be attached to the circuit;
   (c) placing the components in the pockets, the pockets being so shaped and arranged that the component leads extend along the mounting surface and portions of the leads overlap the lead-contact areas of the printed circuit;
   (d) melting end portions of the studs and forming the melted material about adjacent portions of the component to form plastic locking sections that fasten the adjacent portions of the component to the substrate; and then
   (e) attaching the leads to the contact areas of the printed circuit.

18. A printed circuit-and-component assembly fabricated in accordance with the methods of any of claims 1, 2, 6, 9, 10, 11, or 17.

* * * * *